US006344306B1

(12) United States Patent
Fujiyoshi et al.

(10) Patent No.: US 6,344,306 B1
(45) Date of Patent: Feb. 5, 2002

(54) DIRECTLY IMAGEABLE WATERLESS PLANOGRAPHIC PRINTING PLATE PRECURSOR, AND DIRECTLY IMAGEABLE WATERLESS PLANOGRAPHIC PRINTING PLATE

(75) Inventors: Kunitaka Fujiyoshi; Kazuki Goto; Kimikazu Nagase; Gentaro Ohbayashi, all of Shiga (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 09/522,039

(22) Filed: Mar. 9, 2000

(30) Foreign Application Priority Data

| | | |
|---|---|---|
| Mar. 16, 1999 | (JP) | 11-070044 |
| Mar. 16, 1999 | (JP) | 11-070045 |
| Nov. 5, 1999 | (JP) | 11-315956 |

(51) Int. Cl.[7] .......................... B41C 1/10; G03F 7/075; G03F 7/11

(52) U.S. Cl. .................... 430/272.1; 430/303; 101/457; 101/456; 101/467

(58) Field of Search ............................. 430/303, 272.1; 438/18; 101/457, 456, 467

(56) References Cited

U.S. PATENT DOCUMENTS

| | | | | |
|---|---|---|---|---|
| 4,118,229 A | * 10/1978 | Stromberger-D'Alton-Rauch et al. | | 96/27 H |
| 4,769,308 A | 9/1988 | Hiruma et al. | | 430/272.1 |
| 5,491,046 A | 2/1996 | DeBoer et al. | | 430/302 |
| 5,786,125 A | 7/1998 | Tsuchiya et al. | | 430/272.1 |
| 5,871,883 A | 2/1999 | Hirano et al. | | 430/272.1 |

FOREIGN PATENT DOCUMENTS

| | | |
|---|---|---|
| EP | 0 802 067 | 5/1997 |
| WO | WO 97/39894 | 10/1997 |

OTHER PUBLICATIONS

Koerner von Gustorf CA 83:97425, abstract of Angew. Chem (1975), 87 (9), pp. 300–9, from Chemical Abstracts, ACS, on line File CAPLUS.*
Fukuda et al, CA 103:150749, abstract of Int. J. Mass Spectrom. Ion Processes (1985), 65 (3), 321–8, from Chemical Abstracts, ACS, on line, File CAPLUS.*
Patent Abstracts of Japan, vol. 1999, No. 03, (Mar. 31, 1999) & JP 10 329443 A (Torey Ind Inc), Dec. 15, 1998.
European Search Report dated Nov. 9, 1999.

* cited by examiner

*Primary Examiner*—Cynthia Hamilton
(74) *Attorney, Agent, or Firm*—Morrison & Foerster LLP

(57) ABSTRACT

This invention provides a directly imageable planographic printing plate precursor with excellent image reproducibility without requiring any complicated process after irradiation with a laser beam. To solve the above problem, this invention is constituted as describe below. A directly imageable waterless planographic printing plate precursor, in which at least an ink acceptable layer and a silcone rubber layer are laminated in this order on a substrate, wherein when the printing plate precursor is measured by TG-GC/MS in a hellium current at a heating rate of 10° C./min, a decomposition product is generated in a temperature range of 100° C. to 200° C. by 0.001 $g/m^2$ to 1 $g/m^2$ per plate area.

16 Claims, No Drawings

DIRECTLY IMAGEABLE WATERLESS PLANOGRAPHIC PRINTING PLATE PRECURSOR, AND DIRECTLY IMAGEABLE WATERLESS PLANOGRAPHIC PRINTING PLATE

BACKGROUND OF THE INVENTION

The present invention relates to a printing plate precursor which allows printing without using dampening water, especially a directly imageable waterless planographic printing plate precursor which can be directly processed by a laser beam.

The processing method of producing an offset printing plate directly from an original without using a process film, so-called direct processing begins to be used also in the fields of general offset printing and gravure printing, as well as in the light printing industry, because of such features as simplicity requiring a little skill, speediness in obtaining a printing plate in a short time, and rationality of selectability adapted to desired quality and cost from a variety of systems.

Especially recently, in response to the rapid progress of output systems such as prepress systems, image setters and laser printers, new types of various planographic printing plate materials are being developed.

The processing methods for these planographic printing plates include methods of irradiating with a laser beam, methods of writing by a thermal head, methods of partially applying a voltage by a pin electrode, methods of forming an ink repellent layer or an ink acceptable layer by ink jet, etc.

Among them, the methods of using a laser beam are more excellent than the other methods in resolution and processing speed, and are diverse.

Especially usefulness of the heat mode type methods is being reviewed recently because of its advantage of handling in a daylight room and the sudden progress of semiconductor lasers used as the light source.

For example, Japanese Patent Laid-Open (Kokai) No. Hei6-199064, U.S. Pat. Nos. 5,339,737, 5,353,705, EP 0580393, etc. describe directly imageable waterless planographic printing plate precursors using a laser beam as the light source, and processing methods thereof.

The heat sensitive layer of any of these heat destructive planographic printing plate precursors uses mainly carbon black as a laser beam absorbing compound and nitrocellulose as a thermally decomposable compound. The laser beam absorbed by carbon black is converted into heat energy, and the heat destroys the heat sensitive layer. Finally, the destroyed area is removed by development, to simultaneously remove the silicone rubber layer on the surface, and an ink acceptable layer remains.

However, such a printing plate has a problem that since the heat sensitive layer is destroyed to form an image, the ditch cells of the image area become deep, to lower the ink acceptability at very small half tone dots, shortening the ink mileage. Furthermore, since the heat sensitive layer has a crosslinked structure formed to allow easier thermal destruction, the printing plate is poor in printing durability disadvantageously. If the heat sensitive layer is softened, the sensitively declines extremely. So, it is difficult to soften the heat sensitive layer.

Furthermore, the printing plate also has a problem that since the sensitivity is low, a laser beam with a high intensity must be used for destroying the heat sensitive layer.

Japanese Patent Laid-Open (Kokai) No. Hei9-239942 proposes a printing plate of peel-apart type with a laser beam sensitive layer containing a substance capable of generating an acid and a macromolecular compound capable of being decomposed by the action of the acid, but it requires two steps of laser beam irradiation and heating and has a problem peculiar to the peel-apart type that the reproducibility of fine half tone dots is poor.

Japanese Patent Laid-Open (Kokai) No. Hei6-55723, EP 0573091 and U.S. Pat. No. 5,378,580 also have another problem that a large-scale exposure apparatus is required since they use an Nd-YAG laser as the light source.

In addition to the above mentioned planographic printing plates using a laser beam, a thermal bonding type directly imageable waterless planographic printing plate can be considered as a directly imageable waterless planographic printing plate.

In this type of printing plate, the silicone rubber layer remains selectively at the laser beam irradiated area, to function as a non-image area. As for the mechanism, the laser beam irradiation improves the bonding strength between the silicone rubber layer and the laser beam sensitive layer, or the bonding strength between the laser beam sensitive layer and the underlying substrate anyway, and as a result, the silicone rubber layer or the silicone rubber layer and the laser beam sensitive layer are removed selectively at the non-irradiated area by subsequent treatment.

The printing plates proposed in Japanese Patent Laid-Open (Kokai) No. Hei9-120157 and U.S. Pat. No. 5,786,125 use the acid generated by laser beam irradiation as a catalyst to promote the reaction of the photosensitive layer, for reproducing the image. However, to promote the reaction after acid generation, a step of heat treatment is necessary. Furthermore, since the time till heat treatment after acid generation affects the image reproducibility, the image reproducibility becomes unstable disadvantageously.

The printing plate proposed in Japanese Patent Laid-Open (Kokai) No. Hei9-300837 has a foamable layer, and the foamable layer is foamed by irradiation with a laser beam, to give expanding strain to the silicone rubber layer laminated on the foamable layer. Subsequently the base film is removed to form a deep etched plate. However, foaming so much as to give expanding strain to the silicone rubber layer requires enormous energy, and the formation of a deep etched plate by removing the base film causes the silicone rubber layer to remain partially, and a good plate cannot be obtained at low energy.

SUMMARY OF THE INVENTION

This invention improves the disadvantages of the prior art, and provides a direct imageable waterless planographic printing plate having good image reproducibility without requiring any complicated process after laser beam irradiation.

To solve the above problems, this invention is constituted as follows.

A directly imageable waterless planographic printing plate precursor, in which at least an ink acceptable layer and a silicone rubber layer are laminated in this order on a substrate, wherein when the printing plate precursor is measured by TG-GC/MS in a helium current at a heating rate of 10° C./min, a decomposition product is generated in a temperature range of 100° C. to 200° C. by 0.001 $g/m^2$ to 1 $g/m^2$ per plate area.

A directly imageable waterless planographic printing plate precursor, in which at least an ink acceptable layer and a silicone rubber layer are laminated in this order on a substrate, wherein a decomposition product is produced between the ink acceptable layer and the silicone rubber layer by exposure to a laser beam.

A directly imageable waterless planographic printing plate precursor, in which at least an ink acceptable layer and a silicone rubber layer are laminated in this order on a substrate, wherein when the surface of the ink acceptable layer is measured by ESCA after exposure to a laser beam, the increase of C—O component is observed compared to the value measured before exposure to a laser beam.

DETAILED DESCRIPTION OF THE INVENTION

In this invention, "directly imageable" means that an image is formed on the printing plate directly from a recording head without using a negative or positive film at the time of exposure. This invention is described below in detail.

If the directly imageable waterless planographic printing plate precursor of this invention is irradiated with a laser beam, a decomposition product is generated on the surface of the ink acceptable layer. If the decomposition product is precipitated between the ink acceptable layer and the silicone rubber layer, or if the outermost surface of the ink acceptable layer in contact with the silicone rubber layer is foamed by a generated decomposition product, the bonding strength between the silicone rubber layer and the ink acceptable layer is weakened. So, it can be considered that if a physical rubbing force is given from the surface of the printing plate by a brushing development, the laser beam exposed area is removed to form an image.

On the other hand, inside the ink acceptable layer at the laser beam irradiated area, thermosetting takes place. As a result, the solvent resistance of the ink acceptable layer at the laser beam irradiated area is enhanced, and in the subsequent development treatment, the very surface of the ink acceptable layer at the laser beam irradiated area and the silicone rubber layer only are removed, to obtain a printing plate having most of the ink acceptable layer remaining.

The printing plate obtained like this has merits that the reproducibility of very small half tone dots and the ink mileage are good, since the solvent resistance of the ink acceptable layer at the image area is high and since most of the ink acceptable layer remains.

The amount of the decomposition product generated has close relation with the image reproducibility. Since the temperature of the ink acceptable layer when it is irradiated with a laser beam is consdered to be 100° C. to 200° C., the amount of the decomposition product generated in this temperature range is important.

The amount of the decomposition product generated can be measured by TG-GC/MS. The directly imageable planographic printing plate precursor of this invention generates a decomposition product gas in a temperature range of 100° C. to 200° C. when heated at a rate of 10° C./min in a helium current. The amount of the generated gas is 0.001 $g/m^2$ to 1 $g/m^2$, preferably 0.005 $g/m^2$ to 0.5 $g/m^2$, more prefereably 0.01 $g/m^2$ to 0.2 $g/m^2$ as weight per unit area of the printing plate precursor.

If the amount of the generated gas is less than 0.001 $g/m^2$, a sufficient effect to weaken the bonding between the silicone rubber layer and the ink acceptable layer cannot be obtained, and as a result, the silicone rubber layer cannot be sufficiently removed by development, to lower image reproductibility. If the amount of the generated gas is more than 1 $g/m^2$, the ink acceptable layer is greatly affected, and may also be removed at the time of development. Furthermore, if the quantity of heat applied when the ink acceptable layer is prepared is small, the amount of the generated gas may become large, and in this case, since the thermal crosslinking reaction of the ink acceptable layer does not take place sufficiently, the ink acceptable layer is removed at the time of development.

The generated decomposition product is considered to consist of CO, $CO_2$, $H_2O$, remaining solvent, etc. judging from the results of TG-GC/MS measurement. Furthermore, when a thermally decomposable compound is contained in the ink acceptable layer, its decomposition product is generated. If a metal-containing organic compound is used as the thermally decomposable compound, its ligand is generated. If a nitro compound is used, NOx is generated. If a peroxide is used, $O_2$, methanol, etc. are generated. If an azo compound or diazo compound is used, $N_2$, etc. are generated. Particular examples include polar solvents, polar substances, etc. such as acetylacetone and butanol, though not limited to them.

To lower the bonding strength between the ink acceptable layer and the silicone rubber layer by precipitating the decomposition product at the interface, a compound with a polar group is preferable as the decomposition product, since the intended effect can be achieved by a small amount. It is preferable that the polar group is selected from an amino group, imino group, alcohol group, phenol group, carboxylic acid group, carbonyl group, aldehyde group, ester group, ether group, amido group, imido group, nitrile group and sulfido group.

The precipitation of a decomposition product with such a polar group at the interface between the ink acceptable layer and the silicone rubber layer can be detected by a surface analysis means such as ATR or ESCA.

For example, the C—O component in the surface of the ink acceptable layer can be confirmed by a peak of 285 to 290 eV at a binding energy of 1 s peak in ESCA measurement. It is especially preferable that when the surface of the ink acceptable layer is measured by ESCA before exposure to a laser beam and after exposure to a laser beam, the peak intensity increases by 5% or more in the measurement after exposure to a laser beam.

The details of the respective layers for obtaining such a directly imageable printing plate precursor are described below.

[Substrate]

The substrate used in the directly imageable printing plate precursor of this invention can be any of metals, films, etc. as far as it is a dimensionally stable plate. Preferable dimensionally stable plates which can be used here include those used as substrates of conventional printing plates, such as paper, paper laminated with a plastic material (polyethylene, polypropylene or polystyrene, etc.), a metallic plate of aluminum, zinc or copper, etc., a plastic film of cellulose acetate, polyethylene terephthalate, polyethylene, polyester, polyamide, polyimide, polystyrene, polypropylene, polycarbonate or polyvinyl acetal, etc., paper or plastic film having a metal laminated or vapor-deposited, etc.

Among them, an aluminum plate is especially preferable since it is dimensionally very stable and inexpensive. Furthermore, a polyethylene terephthalate film used as a substrate for light printing can also be preferably used.

[Ink Acceptable Layer]

It is preferable that the directly imageable printing plate precursor of this invention contains a light-heat converting substance, to form an image by irradiation with a laser beam. The light-heat converting substance absorbs the laser beam, to generate heat and to be decomposed for generating a decomposition product, or to give heat energy to another substance, for decomposing the other substance, thereby generating a decomposition product.

The light-heat converting substance is only required to absorb the laser beam. The additives which can be used here as the light-heat converting substance include black pigments such as carbon black, aniline black and cyanine black, green pigments of phthalocyanine and naphthalocyanine, carbon graphite, iron powder, diamine metal complexes, dithiol metal complexes, phenolthiol metal complexes, mercaptophenol metal complexes, crystal water-containing inorganic compounds, copper sulfate, chromium sulfide, silicate compounds, metal oxides such as titanium oxide, vanadium oxide, manganese oxide, iron oxide, cobalt oxide and tungsten oxide, hydroxides and sulfates of these metals, metallic powders of bismuth, iron, magnesium and aluminum, etc.

Among them, carbon black is preferable in view of light-heat conversion rate, economy and handling convenience.

In addition to the above substances, a dye capable of absorbing infrared rays or near infrared rays can also be preferably used as the light-heat converting substance.

The dyes which can be used here include all the dyes with the maximum absorption wavelength in a range of 400 nm to 1200 nm. Preferable dyes include acid dyes, basic dyes and oil soluble dyes for electronics and recording, based on cyanine, phthalocyanine, phthalocyanine metal complex, naphthalocyanine, naphthalocyanine metal complex, dithiol metal complex, naphthoquinone, anthraquinone, indophenol, indoaniline, pyrylium, thiopyrylium, squarylium, croconium, diphenylmethane, triphenylmethane, triphenylmethane phthalide, triallylmethane, phenothiazine, phenoxazine, fluoran, thiofluoran, xanthene, indolylphthalide, spiropyran, azaphthalide, chromenopyrazole, leucoauramine, Rhodamine lactam, quinosoline, diazaxanthene, bislactone, fluorenone, monoazo, ketone imine, disazo, polymethine, oxazine, Nigrosine, bisazo, bisazostilbene, bisazooxadiazole, bisazaflorenone, bisazohydroxyperinone, azo chrome complex salt, triazotriphenylamine, thioindigo, perylene, nitroso, 1:2 metal complex salt, intermolecular CT(charge transfer) dyes, quinoline, quinophthalone and fulgide, triphenylmethane leuco-pigments, cationic dyes, azo disperse dyes, benzothiopyran spiropyran, 3,9-dibromoanthoanthorone, indanthrone, phenolphthalein, sulfophthalein, ethyl violet, methyl orange, fluorescien, methylviologen, Methylene Blue, dimroth betaine etc.

Among them, dyes for electronics and recording with the maximum absorption wavelength in a range of 700 nm to 900 nm can be preferably used, which include cyanine dyes, azulenium dyes, squalilium dyes, croconium dyes, azo disperse dyes, bisazostilbene dyes, naphthoquinone dyes, anthraquinone dyes, perylene dyes, phthalocyanine dyes, naphthalocyanine metal complex dyes, polymethine dyes, dithiol nickel complex dyes, indoaniline metal complex dyes, intermolecular CT dyes, benzothiopyran spiropyran, Nigrosine dyes, etc.

Among the above dyes, those with a larger molar absorption coefficient($\epsilon$) can be preferably used. Particularly those of $\epsilon=1\times10^4$ or more are preferable, and those of $1\times10^5$ or more are more preferable. If $\epsilon$ is smaller than $1\times10^4$, the sensitivity improving effect is less likely to be manifested.

Any one of these light-heat converting substance has the sensitivity improving effect, but if two or more are used in combination, the sensitivity can be further improved.

Furthermore, if two or more light-heat converting substances different in absorption wavelength are used together, the printing plate can respond to two or more lasers different in emission wavelength.

It is preferable that the light-heat converting substance content is 0.1 to 70 wt % based on the weight of the entire ink acceptable layer composition. A more preferable range is 0.5 to 40 wt %. If the content is less than 0.1 wt %, the effect of improving the sensitivity to the laser beam cannot be obtained, and if more than 70 wt %, the printing durability of the printing plate is likely to decline.

It is preferable that the ink acceptable layer of the directly imageable printing plate precursor of this invention contains a binder resin. The binder resin functions to improve the shape retention and the printing durability of the printing plate. It also can be expected to generate a decomposition product, if it receives energy from the light-heat converting substance. In this case, the binder resin is not especially limited as far as it is soluble in the organic solvent and can form a film, but a binder resin with a glass transition temperature (Tg) of 20° C. or lower is preferable. More preferable is a binder resin with a glass transition temperature of 0° C. or lower.

The resins which can be used as the binder resin soluble in the organic solvent and capable of forming a film, and also capable of retaining the shape include vinyl polymers, unvulcanized rubbers, polyoxides (polyethers), polyesters, polyurethanes, polyamides, etc.

It is preferable that the binder resin content is 5 to 70 wt % based on the weight of the entire ink acceptable layer composition. A more preferable range is 10 to 50 wt %. If the content is less than 5%, the printing durability is likely to decline, and if more than 70 wt %, the sensitivity is likely to decline.

Any one of the above binder resins can be used, or several polymers can also be mixed for use.

It is preferable that the ink acceptable layer of the directly imageable printing plate precursor of this invention contains a thermally decomposable compound. The compounds preferably used as the thermally decomposable compound include metal-containing organic compounds, ammonium nitrate, potassium nitrate, sodium nitrate, carbonate compounds, nitro compounds such as nitrocellulose, organic peroxides, inorganic peroxides, polyvinylpyrrolidone, azo compounds, diazo compounds, tetrazole compounds and hydrazine derivatives.

Especially preferably used are metal-containing organic compounds, organic peroxides, azo compounds and diazo compounds.

A metal-containing organic compound in this invention consists of “a central metal” and “a ligand” as an organic substituent group, and refers to a complex compound in which an organic ligand is coordination-bonded to the metal, or an organic metal compound in which the metal is covalent-bonded to an organic functional group. The ligand as an organic substituent group can be a unidentate ligand or a multidentate ligand, but a multidentate ligand, especially a bidentate ligand is preferable.

Inorganic compounds such as metal oxides are not included here. These metal-containing organic compounds have a feature that they react with a compound containing an active hydrogen group for crosslinking.

The metals preferable as the “central metal” include the metals of the 2nd period to the 6th period of the periodic table. Among them, the metals of the 3rd period to the 5th period are preferable. Al as a metal of the 3rd period, Ti, Mn, Fe, Co, Ni, Cu, Zn and Ge as metals of the 4th period and In and Sn as metals of the 5th period are especially preferable.

Any of the above metals as the center and an organic compound form a "metal-containing organic compound", and such metal-containing organic compounds include the following patterns.

(1) Metal Diketenates

In a metal diketenate, the hydroxyl groups of the enol hydroxyl groups of a diketone are substituted by metal atoms, and the central metal is bonded through oxygen atoms. Since the carbonyl groups of the diketone can be further coordination-bonded to the metal, the compound is relatively stable.

Particularly, metal diketenates include metal pentanedionates (metal acetonates) having 2,4-pentadionate (acetylacetonate), fluoropentadionate, 2,2,6,6-tetramethyl-3, 5-heptanedionate, benzoylacetonate, thenoyltrifluoroacetonate or 1,3-diphenyl-1,3-propanedionate, etc. as the chelate portion, metal acetoacetates having methylacetoacetate, ethylacetoacetate, methacryloxyethylacetoacetate or allylacetoacetate, and salicylaldehyde complex salts.

(2) Metal Alkoxides

A metal alkoxide is a compound in which an alkyl group is bonded to the central metal through an oxygen atom. Metal alkoxides include those of methoxide, ethoxide, propoxide, butoxide, phenoxide, allyloxide, methoxyethoxide, aminoethoxide, etc.

(3) Alkyl Metals

An alkyl metal is a compound in which the central metal is directly bonded to a carbon atom of an alkyl group. Even a compound has a diketone as the chelate portion is included in this pattern if the metal is bonded to a carbon atom. Among alkyl metals, acetylacetone metals can be preferably used.

(4) Metal Carboxylates

Metal carboxylates include metal acetates, metal lactates, metal acrylates, metal methacrylates, metal stearates, etc.

(5) Others

Others include metal-containing organic compounds with an amine such as ethylenediamine, metal oxide-containing organic compounds such as titanium oxide acetonate, metal complexes such as titanocene phenoxide, hetero metal-containing organic compounds having atoms of two or more metals in one molecule.

Among the metal-containing organic compounds as enumerated above, those preferably used include the following:

Aluminum-containing organic compounds such as aluminum isopropylate, mono-sec-butoxyaluminum diisopropylate, aluminum sec-butyrate, ethylacetatoaluml-num diisopropylate, propylacetatoaluminum diisopropylate, butylacetatoaluminum diisopropylate, heptylacetatoaluminum diisopropylate, hexylacetatoaluminum diisopropylate, octylacetatoaluminum diisopropylate, nonylacetatoaluminum diisopropylate, ethylacetatoaluminum diethylate, ethylacetatoaluminum dibutylate, ethylacetatoaluminum diheptylate, ethylacetatoaluminum dinonylate, diethylacetatoaluminum isopropylate, aluminum tris(ethylacetoacetate), aluminum tris(propylacetoacetate), aluminum tris (butylacetoacetate), aluminum tris(hexylacetoacetate), aluminum tris(nonylacetoacetate), aluminum trisacetylacetonate, aluminum bisethylacetoacetate monoacetylacetonate, aluminum diacetylacetonate ethylacetoacetonate, aluminum monoacetylacetonate bispropylacetoacetate, aluminum monoacetylacetonate bisbutylacetoacetate, aluminum monoacetylacetonate bishexylacetoacetate, aluminum monoethylacetoacetate bispropylacetoacetonate, aluminum monoethylacetoacetate bisbutylacetoacetonate, aluminum monoethylacetoacetate bishexylacetoacetonate, aluminum monoethylacetoacetate bisnonylacetoacetonate, aluminum dibutoxide monoacetoacetate, aluminum dipropoxide monoacetoacetate, aluminum dibutoxide monoethylacetoacetate, aluminum oxide acrylate, aluminum oxide octate, aluminum oxide stearate, trisalizarin aluminum, aluminum-s-butoxide bis(ethylacetoacetate), aluminum di-s-butoxide ethylacetoacetate, aluminum-9-octadecenylacetoacetate diisopropoxide, aluminum phenoxide, aluminum acrylate, aluminum methacrylate, etc.

Titanium-containing organic compounds such as isopropyltriisostearoyl titanate, isopropyltri-n-stearoyl titanate, isopropyltrioctanoyl titanate, isopropyltridodecylbenzenesulfonyl titanate, isopropyltris(dioctyl pyrophosphite) titanate, tetraisopropylbis(dioctyl phosphite)titanate, tetraoctylbis(ditridecyl phosphite)titanate, tetra(2,2-diallyloxymethyl-1-butyl)bis(di-tridecyl)phosphite titanate, bis(dioctyl pyrophosphate)oxyacetate titanate, bis(dioctyl pyrophosphate)ethylene titanate, tris(dioctyl pyrophosphate)ethylene titanate, isopropyldimethacrylisostearoyl titanate, isopropylisostearoyldiacryl titanate, isopropyltri(dioctyl phosphate)titanate, isopropyltricumylphenyl titanate, isopropyltri(N-aminoethylaminoethyl)titanate, dicumylphenyl oxyacetate titanate, diisostearoylethylene titanate, isopropyldiisostearoylcumylphenyl titanate, isopropyldistearoylmethacryl titanate, isopropyldiisostearoylacryl titanate, isopropyl-4-aminobenzenesulfonyldi(dodecylbenzenesulfonyl)titanate, isopropyltrimethacryl titanate, isopropyldi(4-aminobenzoyl) isostearoyl titanate, isopropyltri(dioctyl pyrophosphate) titanate, isopropyltriacryl titanate, isopropyltri(N,N-dimethylethylamino)titanate, isopropyltrianthranyl titanate, isopropyloctyl, butyl pyrophosphate titanate, isopropyldi (butyl, methyl pyrophosphate)titanate, tetraisopropyldi (dilauroyl phosphite)titanate, diisopropyl oxyacetate titanate, isostearoyl methacryloxyacetate titanate, isostearoyl acryloxyacetate titanate, di(dioctyl phosphate) oxyacetate titanate, 4-aminobenzenesulfonyldodecylbenzenesulfonyl oxyacetate titanate, dimethacryl oxyacetate titanate, dicumylphenolate oxyacetate titanate, 4-aminobenzoylisostearoyl oxyacetate titanate, diacryl oxyacetate titanate, di(octyl, butyl pyrophosphate)oxyacetate titanate, isostearoylmethacrylethylene titanate, di(dioctyl phosphate)ethylene titanate, 4-aminobenzenesulfonyldodecylbenzenesulfonylethylene titanate, dimethacrylethylene titanate, 4-aminobenzoylisostearoylethylene titanate, diacrylethylene titanate, dianthranylethylene titanate, di(butyl, methyl pyrophosphate)ethylene titanate, titanium allylacetoacetate triisopropoxide, titanium bis(triethanolamine) diisopropoxide, titanium d-n-butoxide(bis-2,4-pentanediolate), titanium diisopropoxide bis (tetramethylheptanedionate), titanium diisopropoxide bis (ethylacetoacetate), titanium methacryloxyethylacetoacetate triisopropoxide, titanium methylphenoxide, titanium oxide bis(pentanediolate), etc.

The following can also be preferably used in this invention: iron (III) acetylacetonate, dibenzoylmethane iron (II), tropolone iron, tristropolonoiron (III), hinokitiol iron, trishinokitioloiron (III), acetoacetate iron (III), iron (III) benzoylacetonate, iron (III) trifluoropentanedionate, salicylaldehyde copper (II), copper (II) acetylacetonate, salicylaldehydoimine copper, copper cojate, biskojato-copper (II), tropolone copper, bistropolonocopper (II), bis(5-oxynaphthoquinone-1,4)copper, bis(1 -oxyanthraquinone) nickel, acetoacetate copper, salicylamine copper, o-oxyazobenzene copper, copper (II) benzoylacetate, copper (II) ethylacetoacetate, copper (II)

methacryloxyethylacetoacetate, copper (II) methoxyethoxyethoxide, copper (II) 2,4-pentanedionate, copper (II) 2,2,6,6,-tetramethyl-3,5-heptanedionate, zinc N,N-dimethylaminoethoxide, zinc 2,4-pentanedionate, zinc 2,2,6,6-tetramethyl-3,5-heptanedionate, etc.

Furthermore, the following can also be used in this invention: salicylaldehyde cobalt, o-oxyacetophenone nickel, bis(1-oxyxanthone) nickel, nickel pyromeconate, salicylaldehyde nickel, allyl triethyl germane, allyl trimethyl germane, ammonium tris(oxalate) germanate, bis[bis (trimethylsilyl)amino]germanium (II), carboxyethylgermanium sesquioxide, cyclopentadienyl trimethyl germane, di-n-butyl diacetoxy germane, di-n-butyl dichlorogermane, dimethyl aminotrimethyl germane, diphenyl germane, hexallyl digermanoxane, hexaethyl digermanoxane, hexaethyl digermanoxane, hexamethyl digermane, hydroxygermatrane monohydrate, methacryloxymethyl trimethyl germane, methacryloxytriethyl germane, tetraallyl germane, tetra-n-butyl germane, tetraisopropxy germane, tri-n-butyl germane, trimethyl chlorogermane, triphenyl germane, vinyl triethyl germane, bis(2,4-pentanedionate)dichlorotin, di-n-butylbis(2,4-pentanedionate) tin, calcium 2,4-pentanedionate, cerium (III) 2,4-pentanedionate, cobalt (II) 2,4-pentanedionate, cobalt (III) 2,4-pentanedionate, europium 2,4-pentanedionate, europium (III) thenoyltrifuloroacetonate, indium 2,4-pentanedionate, manganese (II) 2,4-pentanedionate, manganese (III) 2,4-pentanedionate, etc.

Among these examples, especially preferably used metal-containing organic compounds are metal chelate compounds having a bidentate ligand, those having particularly acetylacetonate (pentanedionate), ethylacetoacetonate (hexanedionate), propylacetoacetonate (heptanedionate), tetramethylheptanedionate, or benzoylacetonate, etc. as the ligand.

Furthermore, acetylacetonate (pentanedionate), ethylacetoacetonate (hexanedionate), propylacetoacetonate (heptanedionate) tetramethylheptanedionate, benzoylacetonate, etc. of aluminum, iron (III) or titanium are preferable compounds.

Any one of these thermally decomposable compounds can be used, or two or more of them can also be used as a mixture. It is preferable that its content is 1 to 70 wt % based on the weight of the entire ink acceptable layer composition. A more preferable range is 6 to 50 wt %.

The amount of the decomposition product generated depends on the quantity of heat applied when the ink acceptable layer is prepared, and also mainly on the amount of the thermally decomposable compound. If the content of the thermally decomposable compound is kept in a range of 1 to 70 wt % based on the weight of the entire ink acceptable layer composition, the generated amount of the decomposition product can be adjusted in a range from 0.001 $g/m^2$ to 1 $g/m^2$. If the content is kept in a range of 6 to 50 wt %, the image reproducibility and the printing durability can be further improved.

It is preferable that the ink acceptable layer of the directly imageable printing plate precursor of this invention further contains an active hydrogen group-containing compound in view of better adhesion to the silicone rubber layer. The active hydrogen group-containing compound can be a hydroxyl group-containing compound, amino group-containing compound, carboxyl group-containing compound or thiol group-containing compound, etc. However, a hydroxyl group-containing compound is preferable.

Furthermore, as the hydroxyl group-containing compound, either a phenolic hydroxyl group-containing compound or an alcoholic hydroxyl group-containing compound can be used in this invention.

The compounds which can be used as the phenolic hydroxyl group-containing compound include, for example, the following:

Hydroquinone, catechol, guaiacol, cresol, xylenol, naphthol, dihydroxyanthraquinone, dihydroxybenzophenone, trihydroxybenzophenone, tetrahydroxybenzophenone, bisphenol A, bisphenol S, phenolformaldehyde novolak resin, resol resin, resorcinol benzaldehyde resin, pyrogallol acetone resin, hydroxystyrene homopolymer and copolymers, rosin modified phenol resin, epoxy modified phenol resin, lignin modified phenol resin, aniline modified phenol resin, melamine modified phenol resin, bisphenols, etc.

The compounds which can be used as the alcoholic hydroxyl group-containing compound include, for example, the following:

Ethylene glycol, diethylene glycol, triethylene glycol, tetraethylene glycol, polyethylene glycol, propylene glycol, dipropylene glycol, polypropylene glycol, 1,3-butanediol, 1,4-butanediol, 1,6-hexanediol, 1,8-octanediol, 1,9-nonanediol, 1,10-decanediol, 2-butene-1,4-diol, 5-hexane-1, 2-diol, 7-octene-1,2-diol, 3-mercapto-1,2-propanediol, glycerol, diglycerol, trimethylolpropane, 1,2,4-butanetriol, pentaerythritol, dipentaerythritol, sorbitol, sorbitan, polyvinyl alcohol, cellulose and derivatives thereof, hydroxyethyl (meth)acrylate homopolymer and copolymers, etc.

Furthermore, epoxyacrylates, epoxymethacrylates, polyvinyl butyral resin, other polymers with hydroxyl groups introduced, etc. can also be used as the active hydrogen group-containing compound of this invention.

Among these active hydroxyl group-containing compounds, especially a phenolic hydroxyl group-containing compound can be preferably used in view of better adhesion to the silicone rubber layer.

Any one of these active hydrogen group-containing compounds can be used, or two or more of them can also be used as a mixture. It is preferable that the content of the active hydrogen group-containing compound is 5 to 80 wt % based on the weight of the entire ink acceptable layer composition. A more preferable range is 20 to 60 wt %. If the content is smaller than 5 wt %, the adhesion to the silicone rubber layer declines, and the silicone rubber layer is peeled at the time of development. If larger than 80 wt % on the contrary, the solvent resistance of the printing plate is likely to decline.

It is preferable that the ink acceptable layer of the directly imageable printing plate precursor of this invention further contains a thermosetting compound in view of higher developability.

The thermosetting compounds which can be used here include phenol resins, phenol furfural resins, furan resins, epoxy resins, alkyd resins, melamine resins, urea resins, guanamine resins, unsaturated polyester resins, allyl resins, polyimide precursors, etc. A phenol resin such as a novolak resin or resol resin is preferable since it can also function as a hydroxyl group-containing compound.

Furthermore, a composition containing a thermally reactive crosslinking agent can also be used. The crosslinking agent can be a polyfunctional compound having crosslinkability. The crosslinking agents which can be used here include polyfunctional blocked isocynates, polyfunctional epoxy compounds, polyfunctional acrylate compounds, metal chelate compounds, polyfunctional aldehydes, polyfunctional mercapto compounds, polyfunctional alkoxysilyl compounds, polyfunctional amine compounds, polyfunctional carboxylic acids, polyfunctional vinyl compounds, polyfunctional diazonium salts, polyfunctional azide compounds hydrazine, etc. Any one or more as a mixture of these crosslinking agents can be used.

To promote the reaction of the crosslinking agent, a catalyst can also be added.

It is especially preferable to use a phenol resin as the thermosetting compound and to use a metal-containing organic compound as the thermally decomposable compound, since the metal-containing organic compound also functions as the crosslinking agent of the thermosetting compound in the ink acceptable layer.

Any one of these thermosetting compounds can be used, or two or more of them can also be used as a mixture. It is preferable that the content of the thermosetting compound is 5 to 80 wt % based on the weight of the entire ink acceptable layer composition. A more preferable range is 20 to 60 wt %. If the content is smaller than 5 wt %, the developability of the printing plate declines, and if larger than 80 wt % on the contrary, the sensitivity of the printing plate is likely to decline.

The function of the thermosetting compound is described below. In exposure to a laser beam, the ink acceptable layer becomes high in temperature in the surface zone, and the compound is partially decomposed to cause foaming, but is thermoset in the intermediate zone below the surface zone, where the temperature is relatively low. So, after completion of exposure, the image area has a structure where the silicone rubber layer lower in adhesiveness is laminated on the hard ink acceptable layer. Therefore, it can be considered that since the brushing force is concentrated at the interface at the time of brush development, developability is improved.

Furthermore in this invention, the ink acceptable layer may arbitrarily contain, as required, a leveling agent, surfactant, dispersing agent, plasticizer, etc.

Any of various coupling agents such as a silane coupling agent can be added very preferably to enhance the adhesion between the substrate and the ink acceptable layer or to enhance the adhesion between the heat insulating layer and the ink acceptable layer.

Furthermore, to enhance the adhesion to the silicone rubber layer formed above, a silane coupling agent or an unsaturated group-containing compound can also be preferably added.

The composition destined to form the ink acceptable layer is dissolved into a proper organic solvent such as tetrahydrofuran, dimethylformamide, methyl ethyl ketone, methyl isobutyl ketone, butanol or acetylacetone, to prepare a composition solution.

The composition solution is applied uniformly onto the substrate or the heat insulating layer formed on the substrate, and heated at a necessary temperature for a necessary time, to volatilize the organic solvent, and to thermoset the composition, thus forming the ink acceptable layer.

It is preferable that the physical properties of the ink acceptable layer obtained like this are in specific ranges in view of the printing properties of the obtained printing plate. Typical physical properties include tensile properties, above all, the initial modulus at the time of pulling. Particularly, it is preferable that the initial modulus of the ink acceptable layer of the printing plate at the time of pulling is $6.8\times10^7$ Pa to $7.7\times10^8$ Pa. A more preferable range is $9.8\times10^7$ Pa to $6.4\times10^8$ Pa.

If the initial modulus of the ink acceptable layer is set in the above range, the properties, particularly printing durability of the printing plate can be improved. If the initial modulus is less than $6.8\times10^7$ Pa, the ink acceptable layer forming the image area becomes sticky, and pulling is likelyto occur during printing. Furthermore, if the initial modulus is more than $7.7\times10^8$ Pa, rupture is likely to occur at the bonding interface between the heat sensitive layer and the silicone rubber layer due to the repeated stress applied during printing, to lower the printing durability.

It is preferable that the thickness of the ink acceptable layer is 0.1 to 10 g/m$^2$ as a covering layer, in view of the printing durability of the printing plate, likeliness to volatilize the diluting solvent, and excellent productivity. A more preferable range is 1 to 7 g/m$^2$

[Silicone Rubber Layer]

For the silicone rubber layer, either addition polymerization type or condensation polymerization type can be used.

An addition polymerization type silicone rubber layer contains a vinyl group-containing polydimethylsiloxane, SiH group-containing polysiloxane, a reaction inhibitor for controlling the curing rate, and a curing catalyst.

The vinyl group-containing polydimethylsiloxane has a structure represented by the following general formula (I), and has vinyl groups at the molecular ends and/or in the main chain.

(I)

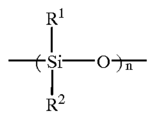

(where n denotes an integer of 2 or more, and $R^1$ and $R^2$ denote, respectively independently, at least one selected from a group consisting of substituted or non-substituted alkyl groups with 1 to 50 carbon atoms, substituted or non-substituted alkenyl groups with 2 to 50 carbon atoms, and substituted or non-substituted aryl groups with 4 to 50 carbon atoms.)

It is preferable in view of the ink repellency of the printing plate, that 50% or more of all the groups represented by $R^1$ and $R^2$ in the formula are methyl groups.

A vinyl group-containing polydimethylsiloxane with a molecular weight of thousands to hundreds of thousands can be used, but in view of handling convenience, the ink repellency and flaw resistance of the obtained printing plate, etc., it is preferable to use a compound with a weight average molecular weight of 10,000 to 200,000. A more preferable range is 30,000 to 150,000.

The SiH group-containing polysiloxane can be a polysiloxane with SiH groups in the molecular chain or at the ends, and can be selected, for example, from the compounds represented by the following general formulae:

(II)

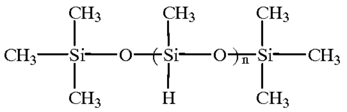

(III)

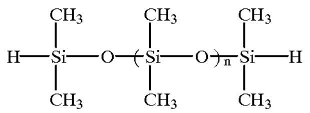

-continued (IV)

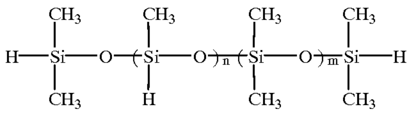

(V)

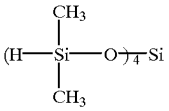

(where n is an integer of 1 or more, and m is an integer of 1 or more.)

It is preferable that the number of SiH groups in the compound having SiH groups is two or more, and more preferable is three or more.

It is preferable that the added amount of the compound having SiH groups is 3 to 20 wt % based on the weight of the entire composition of the silicone rubber layer. A more preferable range is 5 to 15 wt %.

As for the quantitative ratio of the compound having SiH groups to the polydimethylsiloxane, it is preferable that the molar ratio of the SiH groups/the carbon-carbon double bonds of the polydimethylsiloxane is 1.5 to 30. A more preferable range is 10 to 20. If the molar ratio is less than 1.5, the silicone rubber layer may be insufficiently cured, and if more than 30 on the contrary, the physical properties of the rubber become fragile, to adversely affect the flaw resistance, etc. of the printing plate.

The compounds which can be used as the reaction inhibitor include nitrogen-containing compounds, phosphorus compounds, unsaturated alcohols, etc., but it is preferable to use an alcohol containing an acetylene group, or a nitrogen-containing compound, etc.

The preferable amount of the reaction inhibitor added is 0.01 to 10 wt % based on the weight of the silicone rubber composition. A more preferable range is 1 to 5 wt %.

The compounds which can be used as the curing catalyst include group III transition metal compounds, preferably platinum compounds such as platinum, platinum chloride, chloroplatinic acid, olefin coordinated platinum, alcohol modified complex of platinum, methylvinyl polysiloxane complex of platinum, etc.

It is preferable that the amount of the curing catalyst is 0.01 to 20 wt % as the solid content in the silicone rubber layer. A more preferable range is 0.1 to 10 wt %. If the added amount of the catalyst is smaller than 0.01 wt %, the silicone rubber layer is cured insufficiently, and the adhesion to the ink acceptable layer may also be insufficient. On the other hand, if larger than 20 wt %, the pot life of the silicone rubber layer solution may be adversely affected. It is preferable that the amount of the metal such as platinum in the silicone rubber layer composition is 10 to 1000 ppm. A more preferable range is 100 to 500 ppm.

In addition to the above ingredients, the silicone rubber layer may also contain a hydroxyl group-containing organopolysiloxane or hydrolyzable functional group-containing silane (or siloxane) used in the composition of a condensation polymerization type silicone rubber layer, a filler such as silica for improving the rubber strength, and a silane coupling agent, titanate based coupling agent, or aluminum based coupling agent, etc. for improving the adhesion. Preferable silane coupling agents include alkoxysilanes, acetoxysilanes, ketoximinesilanes, etc. Especially a coupling agent having a vinyl group or a ketoximinesilane is preferable.

The ingredients constituting the condensation polymerization type silicone rubber layer include a hydroxyl group-containing polydimethylsiloxane, a crosslinking agent (de-acetic-acid type, de-oxime type, de-alcohol type, de-amine type, de-acetone type, de-amide type, de-aminoxy type, etc.) and a curing catalyst.

The hydroxyl group-containing polydimethylsiloxane also has a structure represented by said general formula (I). The hydroxyl groups can be positioned at the molecular ends and/or in the main chain, but a polydimethylsiloxane having hydroxyl groups at the molecular ends can be preferably used.

For $R^1$ and $R^2$ in the general formula, it is similarly preferable in view of the ink repellency of the printing plate, that 50% or more of all the groups are methyl groups. A polydimethylsiloxane with a molecular weight of thousands to hundreds of thousands can be used, but in view of handling convenience, the ink repellency, flaw resistance, etc. of the obtained printing plate, it is preferable to use a polydimethylsiloxane with a weight average molecular weight of 10,000 to 200,000. A more preferable range is 30,000 to 150,000.

The compounds which can be used as the crosslinking agent in the condensation polymerization type silicone rubber layer include acetoxysilanes, alkoxysilanes, ketoximinesilanes, allyloxysilanes, etc. respectively represented by the following general formula (VI).

$$(R^3)_{4-n}SiX_n \qquad (VI)$$

(where n denotes an integer of 2 to 4; $R^3$ denotes a substituted or non-substituted alkyl group with 1 or more carbon atoms, alkenyl group, aryl group, or a group formed by combining the foregoing groups; and X denotes a functional group selected from halogen atom, alkoxy group, acyloxy group, ketoximine group, aminoxy group, amido group and alkenyloxy group.)

It is preferable that n is 3 or 4.

Particularly they include methyltriacetoxysilane, ethyltriacetoxysilane, vinyltriacetoxysilane, methyltrimethoxysilane, methyltriethoxysilane, ethyltrimethoxysilane, ethyltriethoxysilane, tetraethoxysilane, tetrapropoxysilane, vinyltrimethoxysilane, vinyltriphenoxysilane, vinyltriethoxysilane allyltriethoxysilane, vinyltriisopropoxysilane, vinyltrisisopropenoxysilane, vinylmethylbis(methylethylketoximine)silane, methyltri(methylethylketomixine)silane, vinyltri(methylethylketoximine)silane, tetra(methylethylketoximine)silane, diisopropenoxydimethylsilane, triisopropenoxymethylsilane, tetraallyloxysilane, etc.

Among them, an acetoxysilane or ketoximinesilane is preferable in view of the curing rate of the silicone rubber layer, handling convenience, etc.

It is preferable that the added amount of the crosslinking agent represented by general formula (VI) is 1.5 to 20 wt % based on the weight of the entire silicone rubber layer composition. A more preferable range is 3 to 10 wt %.

As the ratio of the crosslinking agent to the polydimethylsiloxane, it is preferable that the molar ratio of functional groups X/the hydroxyl groups of the polydimethylsiloxane is 1.5 to 10.0. If the molar ratio is smaller than 1.5, the silicone rubber layer solution is likely to be gelled, and on the contrary if larger than 10.0, the physical properties of the rubber become fragile to adversely affect the flaw resistance, etc. of the printing plate.

The compounds which can be used as the curing catalyst include acids such as organic carboxylic acids including acetic acid, propionic acid and maleic acid, toluenesulfonic acid and boric acid, alkalis such as potassium hydroxide, sodium hydroxide and lithium hydroxide, amines, metal alkoxides such as titanium tetrapropoxide and titanium tetrabutoxide, metal diketenates such as iron acetylacetonate and titanium acetylacetonate dipropoxide, organic acid salts of metals, etc.

Among them, it is preferable to add an organic acid salt of a metal, and it is especially preferable to use an organic acid salt of a metal selected from tin, lead, zinc, iron, cobalt, calcium and manganese. Particularly such compounds include dibutyltin diacetate, dibutyltin dioctate, dibutyltin dilaurate, zinc octylate, iron octylate, etc.

It is preferable that the amount of the curing catalyst is 0.01 to 20 wt % as the solid content in the silicone rubber layer. A more preferable range is 0.1 to 10 wt %. If the added amount of the catalyst is smaller than 0.01 wt %, the silicone rubber layer is insufficiently cured, and the adhesion to the ink acceptable layer may also be insufficient. On the other hand, if larger than 20 wt %, the pot life of the silicone rubber layer solution may be adversely affected.

In addition to these ingredients, the composition may contain a filler for improving the rubber strength, and furthermore a silane coupling agent.

It is preferable that the thickness of the silicone rubber layer is 0.5 to 20 $g/m^2$. A more preferable range is 1 to 4 $g/m^2$. If the thickness is smaller than 0.5 $g/m^2$, the ink repellency, flaw resistance and printing durability of the printing plate tend to decline. If larger than 20 $g/m^2$, it is disadvantageous from an economical viewpoint, and the developability and ink mileage are decreased disadvantageously.

[Heat Insulating Layer]

The directly imageable printing plate precursor of this invention can also have a primer layer between the substrate and the ink acceptable layer as a heat insulating layer for preventing that the heat generated by the irradiation with a laser beam strays into the substrate and also as an adhesive layer for intensifying the adhesion between the substrate and the ink acceptable layer.

The materials which can play such roles include epoxy resins, polyurethane resins, phenol resins, acrylic resins, alkyd resins, polyester resins, polyamide resins, urea resins, polyvinyl butyral resin, casein, gelatin, etc. Among them, it is preferable to use any one or more as a mixture of polyurethane resins, polyester resins, acrylic resins, epoxy resins, urea resins, etc.

The heat insulating layer can also contain an additive such as a pigment or dye for improving plate inspectability.

It is preferable from an economical viewpoint, that the thickness of the heat insulating layer is 50 $g/m^2$ or less as a covering layer. More preferable is 10 $g/m^2$ or less.

[Cover Film]

To protect the silicone rubber layer of the directly imageable waterless planographic printing plate constituted as described above, a plain or roughened cover film can be laminated or a polymer coating film capable of being dissolved in the developing solvent can also be formed on the surface of the silicone rubber layer.

The films which can be used as the cover film include polyester films, polypropylene film, polyvinyl alcohol film, saponified ethylene vinyl acetate copolymer film, polyvinylidene chloride film and various metallized films.

[Production Method]

The methods for producing and processing the directly imageable waterless planographic printing plate precursor of this invention are described below.

A substrate is coated, as required, with a heat insulating layer composition using an ordinary coater such as a reverse roll coater, air knife coater, gravure coater, die coater or Meyer bar coater, or a rotary coater such as a whirler, and the coating film is heated at 100 to 300° C. for several minutes or irradiated with an active beam, to be cured. Subsequently, it is coated with an ink acceptable layer composition, and the coating film is heated at 50 to 180° C. for tens of seconds to several minutes, to be dried, and cured as required.

Then, it is coated with a silicone rubber composition, and the coating film is heat-treated at 50 to 200° C. for several minutes, to obtain a silicone rubber layer. Then, as required, a protective film is laminated, or a protective layer is formed.

[Laser Beam Irradiation]

The directly imageable waterless planographic printing plate precursor obtained like this is exposed to a laser beam through an image, after removing the protective film or through the protective film.

The laser beam source used in the exposure step of processing in this invention has an emission wavelength in a range of 300 nm to 1500 nm. The lasers which can be used here include an $Ar^+$ laser, $Kr^+$ laser, helium-neon laser, helium-cadmium laser, ruby laser, glass laser, YAG laser, titanium sapphire laser, dye laser, nitrogen laser, metal vapor laser, excimer laser, free-electron laser, semiconductor laser, etc.

Among them, for processing the printing plate precursor of this invention, a semiconductor laser with an emission wavelength near the near infrared region is preferable, and especially a high output semiconductor layer can be preferably used.

[Development Method]

The development is effected by friction treatment in the presence or absence of water or an organic solvent. The printing plate can also be prepared by peel development, in which a pattern is formed on the printing plate by removing the protective film.

The developer used for development can be, for example, water or water containing a surfactant, or furthermore water containing any of the following polar solvents, or a mixture obtained by adding at least one of the following polar solvents to at least one solvent selected from aliphatic hydrocarbons (hexane, heptane, isoparaffin hydrocarbons, etc.), aromatic hydrocarbons (toluene, xylene, etc.), halogenated hydrocarbons (trichlene, etc.), etc., or any one of the following polar solvents, or two or more of the following polar solvents in combination.

The polar solvents include alcohols such as ethanol, propanol, isopropanol, ethylene glycol, diethylene glycol, polyoxypropylene glycol and 1,3-butylene glycol, ethers such as ethylene glycol monoethyl ether, diethylene glycol monoethyl ether, diethylene glycol monobutyl ether, tetrahydrofuran, diethylene glycol mono-2-ethylhexyl ether, polyoxypropylene monobutyl ether and polyethylene glycol mono-2-ethylhexyl ether, ketones such as acetone, methyl ethyl ketone and diacetone alcohol, esters such as ethyl acetate, ethyl lactate and ethylene glycol monoethyl ether acetate, carboxylic acids such as caproic acid, 2-ethylhexanoic acid and oleic acid, etc.

The developer composition can also contain a surfactant freely. Furthermore, an alkaline material such as sodium carbonate, monoethanolamine, diethanolamine, diglycolamine, monoglycolamine, triethanolamine, sodium silicate, potassium silicate, potassium hydroxide or sodium borate, etc. can also be added.

Among them, water, or water containing a surfactant, or furthermore water containing an alkali can be preferably used.

Moreover, the developer can also contain a basic dye, acid dye or oil soluble dye such as Crystal Violet, Victoria Pure Blue or Anthrazone Red, to dye the ink acceptable layer at the image area simultaneously with development.

For development, a nonwoven fabric, absorbent cotton, cloth or sponge, etc. impregnated with any of these developers can be used to wipe the plate surface, to achieve development.

Development can also be preferably effected by using an automatic developing machine as described in Japanese Patent Laid-Open (Kokai) No. Sho63-163357, to pretreat the plate surface by the developer, and showering with tap water, etc. while rubbing the plate surface using a rotary brush.

Without using any of the above developers, hot water or water vapor can also be sprayed onto the plate surface for development.

[TG-GC/MS Measurement Method]

The method for measuring the amount of the decomposition product gas generated when the direct imageable waterless planographic printing plate precursor of this invention heated at a rate of 10° C./min, and also for measuring the gas generation temperature range (TG-GC/MS measurement) is described below.

The thermogravimetry-gas chromatography/mass spectroscopy (TG-GC/MS) method is a technique for tracing both the weight change of a sample during heating and the concentration change of the gas generated from the sample as a function of temperature.

The TG-MS apparatus consists of a thermogravimeter (TG), mass spectrometer (MS), interface connecting them, and data processing system. TG is a technique for measuring the weight change of a sample during heating. The gas generated from the sample is introduced through a connecting pipe kept warm into a mass spectrometer (MS). On the other hand, the gas generated during TG measurement is partially trapped by an adsorbent, and the adsorbent is re-heated to analyze the generated gas by a gas chromatograph/mass spectrometer (GC/MS), for identifying the gas generated during the TG-MS measurement. This is the TG-GC/MS method.

The TG-GC/MS method allows a generated gas to be detected at a high sensitivity (detection limit on the level of ppb), and the generation rate and amount of the generated gas at each temperature can be determined. In addition, their adequacy can be compared with the result of TG. Furthermore, since TG which is a general purpose thermal analyzer is used as the heater, the method is excellent in view of temperature accuracy, temperature control and temperature range.

The TG measurement can be effected in an inactive gas current such as helium, helium/oxygen mixed current, or air, etc. In this invention, the measurement is effected in a helium gas current. Furthermore, the sample heating rate is not especially limited as far as it is in a range to allow the TG measurement. Usually, measurement is effected at about 1° C./min to about 50° C./min. In this invention, the measurement is effected at 10° C./min.

Usually for the TG measurement, temperature is raised from room temperature. In this invention, since the generated gas amount is measured in a range of 100° C. to 200° C. which is considered to be the temperature of the ink acceptable layer irradiated with a laser beam, measurement can be started from any arbitrary temperature of lower than 100° C.

By the TG-GC/MS measurement of the directly imageable waterless planographic printing plate precursor of this invention, the amount of the decomposition product gas generated by irradiation with a laser beam can be measured.

This invention is described below in more detail in reference to examples.

EXAMPLE 1

A degreased 0.24 mm thick aluminum plate was coated with a solution of the following composition and dried at 200° C. for 2 minutes, to form a 3 $g/m^2$ heat insulating layer.

| < Heat insulating layer composition (solid content 16.7 wt %) > | |
|---|---|
| (1) Epoxy phenol resin "Kan-coat" 90T-25-3094 (produced by Kansai Paint Co.) | 15 parts by weight |
| (2) "Kayasorb" IR-820B (infrared absorbing dye produced by Nippon Kayaku Co.) | 0.16 part by weight |
| [Solvent ingredient] | |
| (1) Dimethylformamide | 85 parts by weight |

This heat insulating layer was coated with the following ink acceptable layer composition, and dried at 130° C. for 1 minute, to form a 1 $g/m^2$ thick ink acceptable layer.

| < Ink acceptable layer composition (solid content 10 wt %) > | |
|---|---|
| (a) "Kayasorb" IR-820B (infrared absorbing dye produced by Nippon Kayaku Co.) | 10 parts by weight |
| (b) "Nâcem titan" (titanium-containing organic compound produced by Nippon Kagaku Sangyo Co.) | 10 parts by weight |
| (c) "Sumilite Resin" PR-50731 (novolak resin produced by Sumitomo Durez Co.) | 40 parts by weight |
| (d) "Sanprene" LQ-T1331 (polyurethane resin produced by Sanyo Chemical Industries Ltd.) | 30 parts by weight |
| (e) N,N,N'-tri(2-hydroxy-3-methacryloxypropyl)-N'-(2-hydroxy-3-trimethoxysilylpropyloxypropyl)-polyoxypropylenediamine | 10 parts by weight |
| [Solvent ingredients] | |
| (1) Dimethylformamide | 100 parts by weight |
| (2) Tetrahydrofuran | 700 parts by weight |
| (3) Isopropyl alcohol | 100 parts by weight |

The ink acceptable layer of the laminate obtained as described above was coated with the following silicone rubber layer composition, and dried at 130° C. for 1 minute, to form a 2 $g/m^2$ thick silicone rubber layer.

| < Silicone rubber layer composition (solid content 9.4 wt %) > | |
|---|---|
| (1) a,w-divinylpolydimethylsiloxane (polymerization degree 770) | 100 parts by weight |
| (2) HMS-501 ((methylhydrogensiloxane)(dimethylsiloxane) copolymer with methyl groups at both the ends produced by Chisso Corp.), number of SiH groups/molecular weight = 0.69 mol/g) | 4 parts by weight |
| (3) SRX-212 (platinum catalyst produced by Toray Dow Corning Silicone Co.) | 0.02 part by weight |
| (4) BY24-808 (reaction inhibitor produced by Toray Dow Corning Silicone Co.) | 0.3 part by weight |
| [Solvent ingredient] | |
| (1) "Isopar" E (produced by Exxon Chemical Japan) | 1000 parts by weight |

An 8 μm thick polyester film, "Lumirror" (produced by Toray Industries Inc.) as a cover film was laminated on the laminate obtained as described above using a calender roller, to obtain a direct imageable waterless planographic printing plate precursor.

After removing the cover film, the printing plate precursor was installed in FX400-AP (processing machine produced by Toray Engineering Co.), and pulse-exposed using a semiconductor laser (wavelength 830 nm, beam diameter 20 μm) for 10 ms at various irradiation energy levels.

In succession, the exposed plate was developed by an automatic developing machine, TWL-650 produced by Toray Industries Inc. In this case, "PP-1" produced by Toray Industries Inc. was used as the pre-treatment liquid, water as the developer, and "PA-F" produced by Toray Industries Inc. as the post-treatment liquid.

Then, an ink for waterless planographic printing (Waterless S red produced by The Ink Tech Co.) was spread on the entire surface of the developed plate by a hand roller, to examine the laser beam irradiation energy at which the image could be reproduced. As a result, it was found that in a range of 175 mJ/s (350 mW) or more, the silicone rubber layer was removed at the laser beam irradiated area, to reproduce the image.

The laser beam exposed area and non-exposed area of the printing plate before development were compared using ATR, and it was found that the absorption of carbonyl groups with a peak at 1730 $cm^{-1}$ increased in the exposed area.

The silicone rubber layer of the plate before development was removed by polishing, and the laser beam exposed area and non-exposed area of the ink acceptable layer were analyzed on the surfaces using ESCA. It was found that the C—O component increased at the exposed area. This suggests that the decomposition product of the compounds contained in the ink acceptable layer was generated on the surface of the ink acceptable layer.

Furthermore, the total reflection IR spectrum was measured. Since the absorption of acetylacetonate rings having a peak at 440 $cm^{-1}$ decreased, it was considered that the "Nâcem titan" was decomposed to produce acetylacetone from the ligand of "Nâcem titan" at the interface between the silicone rubber layer and the ink acceptable layer.

Comparative Example 1

A printing plate precursor was prepared as described for Example 1, except that the following ink acceptable layer composition was used. The plate was similarly evaluated, but the silicone rubber layer could not be removed at the laser beam irradiated area, not allowing development, thus not allowing the image to be reproduced.

| < Ink acceptable layer composition (solid content 10 wt %) > | |
|---|---|
| (b) Iron (III) acetylacetonate (produced by Nakarai Chemical Co., Ltd.) | 20 parts by weight |
| (c) DM622 (epoxy methacrylate produced by Nagase Kasei Kogyo K. K.) | 30 parts by weight |
| (d) "Sanprene" LQ-T1331 (polyurethane resin produced by Sanyo Chemical Industries Ltd.) | 50 parts by weight |
| [Solvent ingredients] | |
| (1) Dimethylformamide | 50 parts by weight |
| (2) Ethyl cellosolve | 25 parts by weight |
| (3) Methyl isobutyl ketone | 25 parts by weight |

The exposed area and the non-exposed area were analyzed on the surfaces using ESCA as described for Example 1, but no difference was observed in composition. This result considered in relation with the result of Example 1 means that in Example 1, the precipitated decomposition product lowered the bonding strength between the silicone rubber layer and the ink acceptable layer, to allow an image to be formed.

EXAMPLE 2

A degreased 0.24 mm thick aluminum plate was coated with a solution of the following composition, and dried at 200° C. for 2 minutes, to form a 3 $g/m^2$ heat insulating layer.

| < Heat insulating layer composition (solid content 16.7 wt %) > | |
|---|---|
| (1) Epoxy phenol resin "Kan-coat" 90T-25-3094 (produced by Kansai Paint Co.) | 15 parts by weight |
| (2) "Kayasorb" IR-820B (infrared absorbing dye produced by Nippon Kayaku Co.) | 0.16 parts by weight |
| [Solvent ingredient] | |
| (1) Dimethylformaldehyde | 85 parts by weight |

This heat insulating layer was coated with the following ink acceptable layer composition, and dried at 130° C. for 1 minute, to form a 1 $g/m^2$ thick ink acceptable layer.

| < Ink acceptable layer composition (solid content 10 wt %) > | |
|---|---|
| (a) "Kayasorb" IR-280B (infrared absorbing dye produced by Nippon Kayaku Co.) | 10 parts by weight |
| (b) "Nâcem titan" (titanium-containing organic compound produced by Nippon Kagaku Sangyo Co.) | 10 parts by weight |
| (c) "Sumilite Resin" PR-50731 (novolak resin produced by Sumitomo Durez Co.) | 60 parts by weight |
| (d) "Sanprene" LQ-T1331 (polyurethane resin produced by Sanyo Chemical Industries Ltd.) | 10 parts by weight |
| (e) N,N,N'-tri(2-hydroxy-3-methacryloxypropyl)-N'-(2-hydroxy-3-trimethoxysilylpropyloxypropyl)-polyoxypropylenediamine | 10 parts by weight |
| [Solvent ingredients] | |
| (1) Dimethylformamide | 100 parts by weight |
| (2) Tetrahydrofuran | 700 parts by weight |
| (3) Isopropyl alcohol | 100 parts by weight |

The ink acceptable layer obtained as described above was coated with the following silicone rubber layer composition, and dried at 130° C. for 1 minute, to form a 2 $g/m^2$ thick silicone rubber layer.

| < Silicone rubber layer composition (solid content 9.4 wt %) > | |
|---|---|
| (1) a,w-divinylpolydimethylsiloxane (polymerization degree 770) | 100 parts by weight |
| (2) HMS-501 ((methylhydrogensiloxane) (dimethylsiloxane) copolymer with methyl groups at both the ends, produced by Chisso Corp., number of SiH groups/molecular weight = 0.69 mol/g) | 4 parts by weight |
| (3) SRX-212 (platinum catalyst produced by Toray Dow Corning Silicone Co.) | 0.02 part by weight |
| (4) BY24-808 (reaction inhibitor produced by Toray Dow Corning Silicone Co.) | 0.3 part by weight |

-continued

| < Silicone rubber layer composition (solid content 9.4 wt %) > | |
|---|---|
| [Solvent ingredient] | |
| (1) "Isopar" E (produced by Exxon Chemical Japan) | 1000 parts by weight |

An 8 μm thick polypropylene film, "Torayfan" (produced by Toray Industries Inc.) was laminated as a cover film on the laminate obtained as described above, using a calender roller, to obtain a directly imageable waterless planographic printing plate precursor.

After removing the cover film, the printing plate precursor was installed in FX400-AP (processing machine produced by Toray Engineering Co.), and pulse-exposed using a semiconductor laser (wavelength 830 nm, beam diameter 20 μm) for 10 ms at various irradiation energy levels.

In succession, the exposed plate was developed by an automatic developing machine, TWL-650 produced by Toray Industries Inc. In this case, "PP-F" produced by Toray Industries Inc. was used as the pre-treatment liquid, water as the developer, and "PA-F" produced by Toray Industries Inc. as the post-treatment liquid.

Then, an ink for waterless planographic printing (Waterless S red produced by The Ink Tech Co.) was spread on the entire surface of the developed plate by a hand roller, to examine the laser beam irradiation energy at which the image could be reproduced. As a result, it was found that in a range of 200 mJ/s or more, the silicone rubber layer was removed at the laser beam irradiated area, to reproduce the image.

The laser beam irradiated area was observed by SEM, and it was found that foam was produced in the outermost surface of the ink acceptable layer at the irradiated area.

Comparative Example 2

A printing plate precursor was produced as described for Example 2, except that the following heat sensitive layer composition was used. It was evaluated similarly. The silicone rubber layer could not be removed at the laser beam irradiated area, not to allow development, not allowing the image to be reproduced.

| < Ink acceptable layer composition (solid content 10 wt %) > | |
|---|---|
| (b) Iron (III) acetylacetonate (produced by Nakarai Chemical Co. Ltd.) | 20 parts by weight |
| (c) DM622 (epoxy methacrylate produced by Nagase Kasei Kogyo K. K.) | 30 parts by weight |
| (d) "Sanprene" LQ-T1331 (polyurethane resin produced by Sanyo Chemical Industries Ltd.) | 50 parts by weight |
| [Solvent ingredients] | |
| (1) Dimethylformamide | 50 parts by weight |
| (2) Ethyl cellosolve | 25 parts by weight |
| (3) Methyl isobutyl ketone | 25 parts by weight |

The laser beam irradiated area was observed by SEM, and the foam as observed in Example 2, could not be observed in the irradiated area.

This result considered in relation with the result of Example 2 means that in Example 2, the foam lowered the bonding strength between the silicone rubber layer and the ink acceptable layer, allowing an image to be formed.

EXAMPLE 3

A degreased 0.24 mm thick aluminum plate was coated with the following ink acceptable layer composition solution using a bar coater, and heat-treated at 140° C. for 90 seconds, to form a 1.5 g/$m^2$ ink acceptable layer.

| | |
|---|---|
| (a) "Kayasorb" IR-820B (infrared absorbing dye produced by Nippon Kayaku Co.) | 10 parts by weight |
| (b) "Nâcem titan" (titanium-containing organic compound produced by Nippon Kagaku Sangyo Co.) | 10 parts by weight |
| (c) "Sumilite Resin" PR50622 (phenol novolak resin produced by Sumitomo Durez Co.) | 70 parts by weight |
| (d) Tetrahydrofuran | 550 parts by weight |
| (e) Dimethylformamide | 350 parts by weight |

Then, the following silicone rubber layer composition was applied to have a dry film thickness of 2.0 μm, and dried at 120° C. for 1 minute.

| | |
|---|---|
| (a) a,w-divinylpolydimethylsiloxane (molecular weight about 60,000) | 100 parts by weight |
| (b) HMS-501 ((methylhydrogensiloxane) (dimethylsiloxane) copolymer with methyl groups at both the ends, produced by Chisso Corp., number of SiH groups/molecular weight = 0.69 mol/g) | 7 parts by weight |
| (c) BY24-808 (reaction inhibitor produced by Toray Dow Corning Silicone Co.) | 3 parts by weight |
| (d) SRX-212 (platinum catalyst produced by Toray Dow Corning Silicone Co.) | 5 parts by weight |
| (e) Vinyltri(methylethylketooxime)silane | 3 parts by weight |
| (f) "Isopar" E (produced by Exxon Chemical Japan) | 1000 parts by weight |

An 8 μm thick polypropylene film, "Torayfan" BO (produced by Toray Industries Inc.) was laminated as a cover film on the laminate obtained as described above using a calender roller, to obtain a directly imageable waterless planographic printing plate precursor.

<TG-GC/MS Measurement>

After removing the cover film, the printing plate precursor was set in an TG-GC/MS apparatus (produced by Shimadzu Corp.), to measure the generated amount of gas in a temperature range of 100° C. to 200° C. in a helium current at a heating rate of 10° C./min. The amount was 0.06 g/$m^2$ per plate area.

<Evaluation of Image Reproducibility>

After removing the protective film, the printing plate precursor was installed in "FX400-AP" (processing machine produced by Toray Engineering Co.), and exposed using a semiconductor laser (wavelength 830 nm, beam diameter 20 μm) for 10 micro sec at an irradiation energy level of 150 mJ/$cm^2$.

In succession, development was effected by "TWL-860KII" (automatic developing machine produced by Toray Industries Inc.), and the silicone rubber layer was removed at the laser beam irradiated area, to obtain a negative waterless planographic printing plate.

At the time of development, "NP-1" (produced by Toray Industries Inc.) was used as the pre-treatment liquid, and water as the developer.

EXAMPLE 4

A printing plate precursor was prepared as described for Example 3, except that iron acetylacetonate was used instead of "Nâcem titan".

The generated amount of the gas was measured in a temperature range of 100° C. to 200° C. as described for Example 3, and was found to be 0.2 $g/m^2$ per plate area.

In succession, the image reproducibility was evaluated as described for Example 3. The silicone rubber layer was removed at the laser beam irradiated area, to obtain a negative waterless planographic printing plate.

EXAMPLE 5

A printing plate precursor was prepared as described for Example 3, except that aluminum acetylacetonate was used instead of "Nâcem titan".

The generated amount of the gas was measured in a temperature range of 100° C. to 200° C. as described for Example 3, and was found to be 0.1 $g/m^2$ per plate area.

In succession, the image reproducibility was evaluated as described for Example 3. The silicone rubber layer was removed at the laser beam irradiated area, to obtain a negative waterless planographic printing plate.

EXAMPLE 6

A printing plate precursor was prepared as described for Example 3, except that titanium ethylacetoacetonate was used instead of "Nâcem titan".

The generated amount of the gas was measured in a temperature range of 100° C. to 200° C. as described for Example 3, and was found to be 0.15 $g/m^2$ per plate area.

In succession, the image reproducibility was evaluated as described for Example 3. The silicone rubber layer was removed at the laser beam irradiated area, to obtain a negative waterless planographic printing plate.

EXAMPLE 7

A printing plate precursor was prepared as described for Example 3, except that titanium propylacetoacetonate was used instead of "Nâcem titan".

The generated amount of the gas was measured in a temperature range of 100° C. to 200° C. as described for Example 3, and was found to be 0.08 $g/m^2$ per plate area.

In succession, the image reproducibility was evaluated as described for Example 3. The silicone rubber layer was removed at the laser beam irradiated area, to obtain a negative waterless planographic printing plate.

The results of Examples 3 to 7 and the metal-containing organic compounds used are shown in Table 1.

TABLE 1

| | Metal chelate compound[1)] | Ink acceptable layer heat treatment condition | Generated amount of gas[2)] ($g/m^2$) | Image reproducibility[3)] evaluation result |
|---|---|---|---|---|
| Example 3 | A | 130° C. × 2 min. | 0.06 | ○ |
| Example 4 | B | 130° C. × 2 min. | 0.2 | ○ |
| Example 5 | C | 130° C. × 2 min. | 0.1 | ○ |
| Example 6 | D | 130° C. × 2 min. | 0.15 | ○ |
| Example 7 | E | 130° C.~2 min. | 0.08 | ○ |

[1)]A: "Nâcem titan"
B: Iron acetylacetonate
C: Aluminum acetylacetonate
D: Titanium ethylacetoacetonate
E: Titanium propylacetoacetonate
[2)]Result of TG-GC/MS measurement with the precursor heated in a helium current at 10° C./min TABLE 1-continued

| Metal chelate compound[1)] | Ink acceptable layer heat treatment condition | Generated amount of gas[2)] ($g/m^2$) | Image reproducibility[3)] evaluation result |
|---|---|---|---|

[3)]Image reproducibility evaluation result
○: Good (image was accurately reproduced)
x: No good (image was poor)

INDUSTRIAL APPLICABILITY

This invention can provide a directly imageable waterless planographic printing plate with good image reproducibility without requiring any complicated process after irradiation with a laser beam.

What is claimed is:

1. A directly imageable waterless planographic printing plate precursor, comprising an ink accepting layer and a silicone rubber layer laminated in this order on a substrate, wherein when the printing plate precursor is measured by TG-GC/MS in a helium current at a heating rate of 10° C./min, a decomposition product is generated in a temperature range of 100° C. to 200° C. in an amount of 0.001 $g/m^2$ to 1 $g/m^2$ of plate area.

2. A directly imageable waterless planographic printing plate precursor, comprising an ink accepting layer and a silicone rubber layer laminated in this order on a substrate, wherein a decomposition product produced at an interface between the ink accepting layer and the silicone rubber layer by exposure of the printing plate precursor to a laser beam is a compound comprising a polar group.

3. A directly imageable waterless planographic printing plate precursor, comprising an ink accepting layer and a silicone rubber layer are laminated in this order on a substrate, wherein when a surface of the ink accepting layer is measured by ESCA after exposure to a laser beam, an increase in a value of a C—O component is observed compared to a value of the C—O component measured by ESCA before the exposure to the laser beam.

4. The directly imageable waterless planographic printing plate precursor according to claim 2, wherein the decomposition product is precipitated between the ink acceptable layer and the silicone rubber layer.

5. The directly imageable waterless planographic printing plate precursor according to claim 2, wherein an outermost surface of the ink accepting layer in contact with the silicone rubber layer is foamed.

6. The directly imageable waterless planographic printing plate precursor according to claim 2, wherein the polar group is selected from an amino group, imino group, alcohol group, phenol group, carboxylic acid group, carbonyl group, aldehyde group, ester group, ether group, amido group, imido group, nitrile group and sulfido group.

7. The directly imageable waterless planographic printing plate obtained by exposing and developing the directly imageable waterless planographic printing plate precursor of claim 6.

8. The directly imageable waterless planographic printing plate precursor according to any one of claims 1 through 3, wherein the ink accepting layer contains a light-heat converting substance.

9. The directly imageable waterless planographic printing plate precursor according to claim 8, wherein the ink accepting layer contains a thermally decomposable compound.

10. The directly imageable waterless planographic printing plate obtained by exposing and developing the directly imageable waterless planographic printing plate precursor of claim 9.

11. The directly imageable waterless planographic printing plate precursor according to claim 8, wherein the ink accepting layer contains an active hydrogen group-containing compound.

12. The directly imageable waterless planographic printing plate obtained by exposing and developing the directly imageable waterless planographic printing plate precursor of claim 11.

13. The directly imageable waterless planographic printing plate precursor according to claim 8, wherein the ink accepting layer contains a thermosetting compound.

14. The directly imageable waterless planographic printing plate, obtained by exposing and developing the directly imageable waterless planographic printing plate precursor of any one of claims 1 through 5.

15. The directly imageable waterless planographic printing plate obtained by exposing and developing the directly imageable waterless planographic printing plate precursor of claim 13.

16. The directly imageable waterless planographic printing plate obtained by exposing and developing the directly imageable waterless planographic printing plate precursor of claim 8.

* * * * *